United States Patent
Sabat et al.

(10) Patent No.: US 8,116,254 B2
(45) Date of Patent: Feb. 14, 2012

(54) WIRELESS REPEATER WITH SMART UPLINK

(75) Inventors: John Sabat, Merrimack, NH (US); Jeffrey Millar, Mont Vernon, NH (US)

(73) Assignee: Powerwave Technologies, Inc., Santa Ana, CA (US)

( * ) Notice: Subject to any disclaimer, the term of this patent is extended or adjusted under 35 U.S.C. 154(b) by 544 days.

(21) Appl. No.: 12/363,591

(22) Filed: Jan. 30, 2009

(65) Prior Publication Data

US 2009/0196215 A1    Aug. 6, 2009

Related U.S. Application Data

(60) Provisional application No. 61/063,050, filed on Jan. 31, 2008.

(51) Int. Cl.
H04B 7/185 (2006.01)
H04B 17/02 (2006.01)
H04J 3/06 (2006.01)

(52) U.S. Cl. .................... 370/318; 370/519; 375/211

(58) Field of Classification Search .......... 370/315–326, 370/503–504, 516–519; 375/135–136, 213–215, 375/226, 297; 455/11.1–13.4, 67.13, 67.16
See application file for complete search history.

(56) References Cited

U.S. PATENT DOCUMENTS

| | | | |
|---|---|---|---|
| 5,195,106 A * | 3/1993 | Kazecki et al. ............... 375/230 |
| 6,697,603 B1 | 2/2004 | Lovinggood et al. |
| 6,836,517 B2 * | 12/2004 | Nagatani et al. .............. 375/296 |
| 6,864,745 B2 * | 3/2005 | Ode et al. ........................ 330/149 |
| 6,873,823 B2 * | 3/2005 | Hasarchi et al. ............. 455/11.1 |
| 7,046,061 B2 * | 5/2006 | Kwak ............................ 327/158 |
| 7,098,734 B2 * | 8/2006 | Hongo et al. ................. 330/149 |
| 7,348,819 B2 * | 3/2008 | Choi ............................. 327/158 |
| 7,415,250 B2 * | 8/2008 | Sasaki et al. ............... 455/114.2 |
| 7,519,336 B2 * | 4/2009 | Vepsalainen et al. ....... 455/127.1 |
| 7,627,287 B2 * | 12/2009 | Moss .............................. 455/16 |
| 2005/0227619 A1 | 10/2005 | Lee et al. |
| 2007/0069773 A1 * | 3/2007 | Choi ............................. 327/158 |
| 2007/0071128 A1 | 3/2007 | Meir et al. |
| 2008/0225929 A1 * | 9/2008 | Proctor et al. ................ 375/214 |

* cited by examiner

Primary Examiner — Thai Hoang
(74) Attorney, Agent, or Firm — OC Patent Law Group

(57) ABSTRACT

An over the air repeater for enhancing wireless communication is provided. The repeater employs a system and method by which strong signals can be prevented from exceeding the repeater's uplink output limits while still providing full operational gain to any concurrently amplified weak signals, while adapting to time slot variations and optionally to frequency hopping variations. Power measurements are performed on each channel with resultant gain changes being performed on delayed versions of those same signals. Digital delay buffers are used to provide adequate processing time to make an accurate determination of the uplink signal levels of each RF carrier. The repeater alternatively monitors the downlink path from the donor base station to determine the frequencies to be processed on the uplink communication.

18 Claims, 9 Drawing Sheets

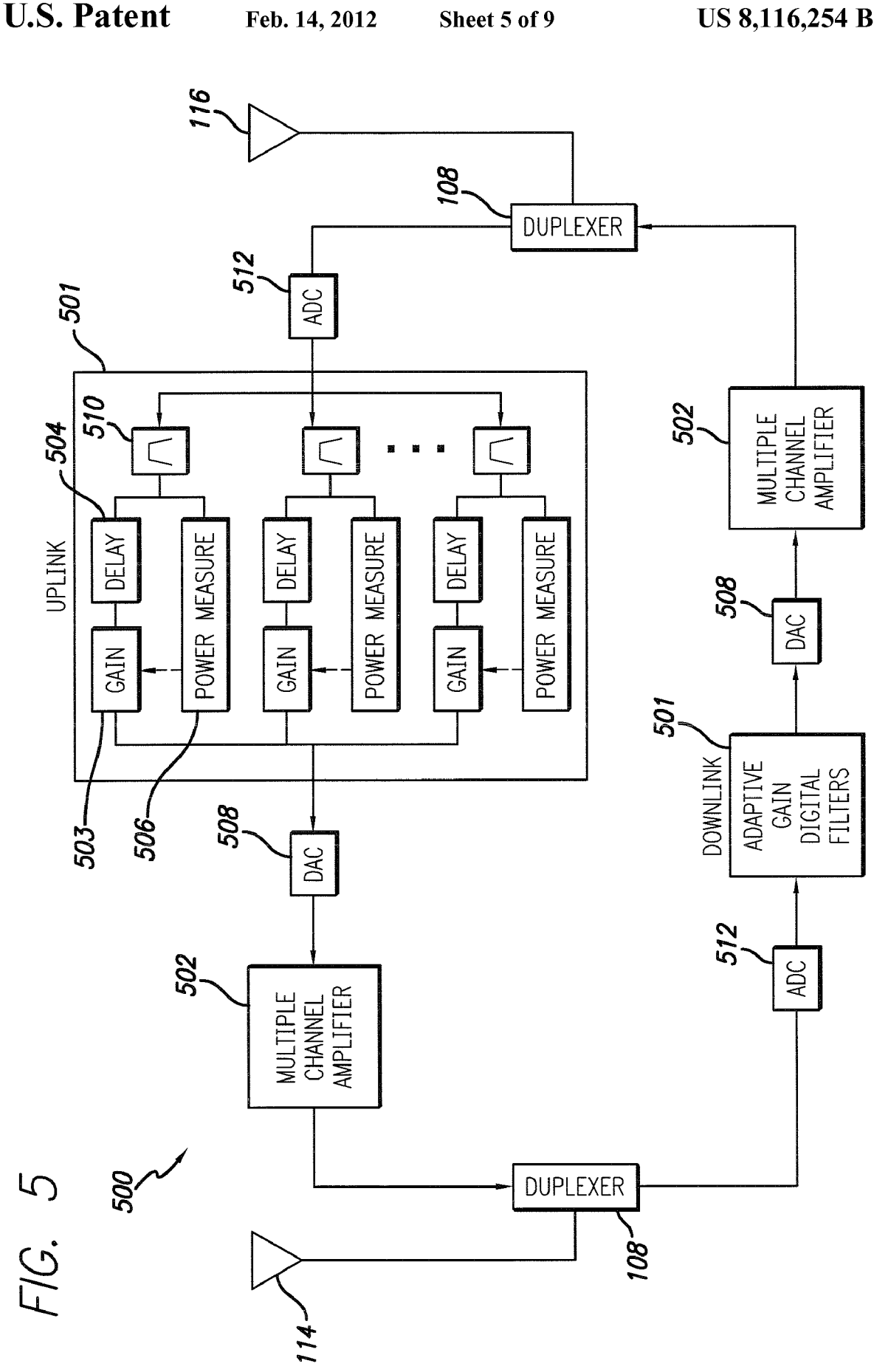

WIRELESS REPEATER WITH SMART UPLINK

RELATED APPLICATION INFORMATION

The present application claims the benefit under 35 USC 119(e) of US provisional patent application Ser. No. 61/063,050 filed Jan. 31, 2008, the disclosure of which is incorporated herein by reference in its entirety.

FIELD OF THE INVENTION

The present invention relates to wireless communications systems and more specifically to systems and methods for providing RF coverage and/or call capacity so that users may connect to the wireless infrastructure.

BACKGROUND OF THE INVENTION

Traditional solutions for providing increased RF coverage and/or call capacity in wireless communications systems rely on some means of distributing RF energy. These range from high power, large coverage area towers to low power in-building pico-cells. There also exists a class of RF enhancement technologies known as RF repeaters. Some are bidirectional RF amplifiers that retransmit the signals received over the air from a host base station, known as over the air repeaters. Others are directly connected to a host base station and distribute the RF signals via either electrical (e.g. coaxial cable) or optical (fiber) distribution networks, known as distributed antenna systems. In some cases, over the air repeaters are combined with these fiber or coaxial based distributed antenna systems.

In all cases over the air repeater systems have significant uplink performance limits when finite power amplifier output capability is combined with input signals simultaneously spanning weak and strong signal levels. Over the air repeater systems encounter further performance limits, for example, the Global System for Mobile Communication (GSM) signals utilize the frequency hopping mode of operation which in conjunction with dynamic range limits severely limits the choice in repeater design and output capability.

More specifically, over the air repeaters bi-directionally amplify wireless signals received from donor base stations on the downlink and those received from the mobile users on the uplink. The gain is usually set as high as possible to compensate for the path loss between the repeater and the donor base station while staying low enough to prevent the repeater's output noise from causing a significant noise rise at the donor base station.

GSM repeaters, especially multi-carrier sub-band units, are confronted with the added challenge of the wide dynamic range differences due to concurrently amplifying signals from both near and far mobile units. Many repeaters have been constructed that use separate RF chains and power amplifiers for each RF channel. This allows separate processing, gain settings and power amplifier output limits for each signal. However, this approach is not cost effective to support a moderate or large number of simultaneous RF channels and may result in impractically sized product solutions. Large carrier counts need broadband repeater solutions which use multi-carrier power amplifiers (MCPA). However, the use of MCPAs on the uplink limits the useful gain range of these types of repeaters and tend to be limited to lower power applications.

The simplest form of a MCPA based repeater will use a multicarrier RF chain in conjunction with the power amplifier (PA). This means that any gain reduction to prevent PA overload due to a strong input signal will also result in the gain reduction of any weak signal(s) being simultaneously received. Thus, the weak signals will not be able to communicate with the donor base station, which is equivalent to reducing the reverse link coverage range of the repeater. Some repeaters may utilize digital processing of the RF signals but will still treat groups of RF channels as a single entity with the associated gain coupling limitations.

As is well known in the art, digital filtering has been used to isolate individual RF channels, to eliminate interfering signals from other wireless operators bands or those intended for other cell sites and not the donor base station of interest. However, limiting the output level of the MCPA through gain changes still couples the effects due to strong signals to the weak signals. This still does not address the limitations imposed by a shared MCPA at the output.

It is possible to implement dynamic gain control over each sub-band/RF channel individually during the digital filtering process. Gain limits can be applied digitally that prevent strong signals from either overloading the power amplifier and can be dynamic enough to adapt to burst level differences in a GSM waveform. However, it takes a finite amount of time to detect the presence of a strong signal and during that time period the PA output will be overloaded. Conversely, starting at low gain will require some time before a weak signal detection decision can be used to increase gain. This is further complicated by the presence of frequency hopping which adds frequency uncertainty to the existing power versus time uncertainty. Finally, none of the prior art addresses techniques to accommodate feedback cancellation operations and the presence of strong feedback signals at the input.

SUMMARY OF THE INVENTION

In a first embodiment of the present invention, a communication system for enhancing wireless coverage for a host base station is provided. The communication system includes a digital repeater receiving and providing time division multiplexed (TDM) communication signals (e.g. GSM and EDGE) between a host base station and a communication network for a plurality of RF channels, a digital filter for each of the plurality of RF channels, the filter being synchronized to the corresponding RF channel timing of the host base station, a delay buffer for each RF channel configured to provide a time delayed TDM signal for a power measurement on the RF channel, a power measurement unit, and a gain setting unit for each RF channel receiving the time delayed communication signal and power measurement for adjusting a gain setting on each RF channel.

It is contemplated that the gain setting for each individual RF channel is set independent from the other of the plurality of RF channels to prevent power amplifier output overload due to varying power levels of each of the plurality of received TDM signals. It is further contemplated that the time delay creates a time differential between a filtered TDM signal from the delay buffer and a filtered TDM signal fed into the power measurement unit.

It is contemplated that the gain setting unit provides gain setting for an output for each of the plurality of RF channels based on automatic limit control (ALC), wherein a power level of the TDM signal is limited to a threshold level. It is further contemplated that automatic limit control gain setting limits may be set to different levels for each of the RF channels.

It is contemplated that an alternative implementation of the gain setting unit provides gain settings for the outputs of each of the plurality of RF channels based on automatic gain control (AGC), wherein a power level of the TDM signal is reduced for strong signals above a threshold level and the power level is increased for a weak signal below the threshold level. It is further contemplated that the automatic gain control adjusts the gain for each incoming TDM signal to a value below a maximum gain level.

It is contemplated that the communication system further includes a broadband digital delay configured for the digital filter to be tuned to an active RF channel before the TDM signal propagates through the repeater. It is further contemplated that a Fast Fourier Transform (FFT) detects an uplink TDM signal and measures the frequency during the leading edge burst of the uplink TDM signal to determine a corresponding RF channel.

It is contemplated that the communication system further includes a down link to uplink delay, and a channel detection unit for determining the downlink frequency which is combined with the downlink to uplink frequency offset to generate tuning commands for an uplink digital filter, wherein frequency tuning is based on the downlink measurement.

In another embodiment of the present invention, a method for adjusting an over the air repeater for enhancing coverage in a wireless communication system is presented. The method includes, providing and receiving a plurality of digital time division multiplexed (TDM) signals (e.g. GESM and EDGE) for each of a plurality of RF channels, filtering and splitting the plurality of digital TDM signals for each of the plurality of RF channels, delaying a digital filtered TDM signal to provide a power measurement of each of the plurality of RF channels, measuring the power level of each of the filtered digital TDM signals; and adjusting the filtered digital TDM signal gain settings based on the individual power measurement on each of the plurality of RF channels.

It is contemplated that the delay creates a time differential between a filtered TDM signal from a delay buffer and a filtered TDM signal fed into the power measurement unit.

It is contemplated that the method further includes controlling the gain setting output for each of the plurality of RF channels based on automatic limit control (ALC), wherein the power level of each TDM signal is limited to a threshold level. It is also contemplated that an alternative method includes controlling the gain setting output for each of the plurality of RF channels based on automatic gain control (AGC), wherein the power level of the TDM signal is reduced for strong signals above a threshold level and the power level is increased for weak signals below the threshold level.

It is contemplated that the method further includes providing a broadband digital delay configured for the digital filter to be tuned to an active RF channel before the TDM signal propagates through the repeater. It is further contemplated that a Fast Fourier Transform (FFT) circuit detects and measures an uplink TDM signal to determine a corresponding RF channel.

It is contemplated that the method further includes determining a downlink frequency which is combined with a downlink to uplink frequency offset and time delay offset to generate tuning commands for an uplink digital filter, wherein frequency tuning is based on the downlink measurement.

In still another embodiment of the present invention, a communication system for enhancing wireless coverage for a host base station is provided. The communication system includes a digital repeater receiving and providing communication signals between a host base station and a communication network for a plurality of RF channels, a Fast Fourier Transform (FFT) circuit for detecting an uplink communication signal and measuring the frequency during the leading edge burst of the uplink communication signal to determine a corresponding RF channel, a first delay buffer configured to provide a time delay for the FFT circuit to detect the uplink communication signal, and a digital filter for each of the plurality of RF channels, the filter being synchronized to the corresponding RF channel timing of the host base station by the FFT circuit.

It is contemplated that the method further includes a second delay buffer for each RF channel configured to provide a time delay for a power measurement on the RF channel, a power measurement unit, and a gain setting unit for each RF channel receiving the time delayed signal and power measurement for adjusting a gain setting on each RF channel. It is further contemplated that gain setting an output for each of the plurality of RF channels is based on at least one of: an automatic limit control (ALC), wherein a power level of the communication signal is limited to a threshold level; and an automatic gain control (AGC), wherein a power level of the communication signal is reduced for strong signals above a threshold level and the power level is increased for weak signals below the threshold level.

Further aspects of the invention will be appreciated by the following detailed description of the invention.

BRIEF DESCRIPTION OF THE DRAWINGS

FIG. 5 is a block schematic diagram of a high power RF repeater having an MCPA uplink using delay based digital processing, according to an embodiment of the present invention.

DETAILED DESCRIPTION OF THE INVENTION

Figure 1:
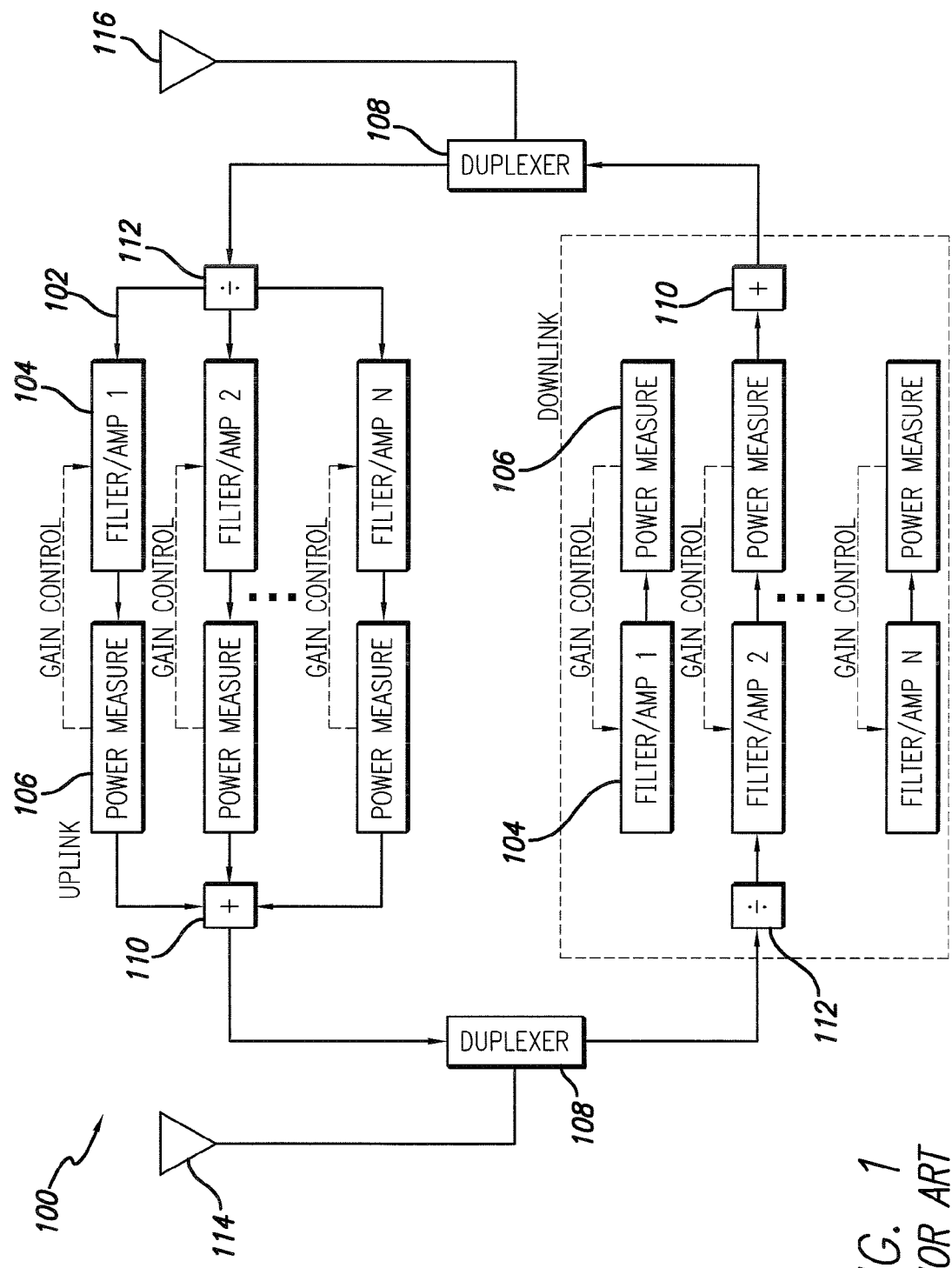
FIG. 1 is a block schematic diagram of a conventional high power RF repeater having a single carrier power amplifier (SCPA) on the uplink band, and using a separate RF chain for each RF channel being processed.

The present invention provides improved wireless over the air repeater and related communications systems and methods. A wireless over the air repeater receives signals, adds gain, and retransmits them. The incoming signals vary widely in amplitude according to the transmitter power and path loss. The outgoing, repeated signals require enough power to overcome path losses but not so much power as to overload the repeater's transmitter.

The input signals have a dynamic range that varies from weak and noisy to extremely strong. For global system for mobile communication (GSM) signals, the dynamic range can approach 70 dB because the weakest runs about −110 dBm and the strongest about −40 dBm. If the repeater had constant gain, the output would also require 70 dB of dynamic range. However, no reasonable power amplifier can provide enough power to add 70 dB to the maximum acceptable input. The minimum signal a repeater has to transmit depends on the path loss between its transmitter and the receiver, and path loss varies between about 50 dB and 100 dB. At 100 dB path loss, the minimum acceptable transmitted GSM signal power corresponds to about +10 dBm. If the transmitter had to increase its power by 70 dB to accommodate a strong handset, the output would rise to 80 dBm or 100,000 Watts.

The present invention overcomes the limits encountered by over the air repeaters when amplifying multiple RF signals with high dynamic range differences between the received signals. This can occur on the uplink when multiple signals are simultaneously being received from mobile units, i.e., some signals are nearby and others are far away. Having strong signals at high repeater gain will result in output requirements that exceed the capabilities of the repeater's power amplifier. Lowering the repeater gain in the presence of strong signals will cause the weaker signals to fail to reach the donor base station. Individual channel based solutions can sometimes counter this problem however they can be impractical for frequency hopping time division multiplexed (TDM) signals such as GSM. Here, dynamic range limits change rapidly with time, e.g., by GSM timeslot, and frequency, e.g., GSM frequency hopping.

An embodiment of the present invention provides a means by which strong signals can be prevented from exceeding the repeater's uplink output limits while still providing full operational gain to any concurrently amplified weak signals, while adapting to time slot and optionally to frequency hopping variations. In one embodiment, the repeater broadband digitizes multiple RF frequencies and digitally filters the spectrum to isolate individual RF channels and/or sub-bands. Power measurements are performed on each channel with resultant gain changes being performed on delayed versions of those same signals. The digital delay buffers are used to provide adequate processing time to make an accurate determination of the uplink signal levels of each RF carrier. The digital delay buffers can also be used to provide adequate processing time to also detect and tune the digital filters to the hopping frequencies.

In another embodiment of the present invention, to accommodate frequency hopping, the repeater alternatively monitors the downlink path from the donor base station to determine the frequencies to be processed on the uplink. In another aspect, the repeater monitors the downlink control channel of the donor base station, e.g., GSM DCCH channel, determine the hop frequencies and hop sequence offset, and to determine the uplink frequencies to be processed. After this, uplink gain processing is the same as with the previous approach.

The present invention also provides two aspects for maximizing uplink performance. In one aspect the uplink measurements are used to cap the output levels, through gain reductions, of individual RF channels or sub-bands. This cap may be allowed to vary depending on the number of active uplink signals in order to maximize uplink gain or reduce power amplifier requirements.

In another aspect for maximizing uplink performance, the repeater attempts to achieve a constant output level for each RF channel regardless of the repeaters RF gain setting. This is used to ensure more robust signal levels at the donor base station. The target output level may also be allowed to vary with the number of active channels in order to minimize power amplifier requirements.

To better appreciate the present invention, conventional repeater configurations will be described first, followed by detailed descriptions of the preferred embodiments of the improved repeater of the present invention.

FIG. 1 is a block schematic diagram of a conventional high power RF repeater 100 having a SCPA 104 and using a separate RF chain for each RF channel 102 being processed. As shown, by way of example, three channels 102 in each direction are illustrated. One direction is for the downlink communication from the donor base station to the user's mobile device, and the other direction is for the uplink communication from the user's mobile device to the donor base station. Typically, the two paths are duplexed by a duplexer 108 to feed a common antenna 114 pointed toward the donor base station and a second antenna 116 providing the coverage service area for a multitude of user devices.

Each RF channel's 102 RF processing chain typically has an independent power measurement/gain unit 106 control capability to limit the output level of the associated power amplifier 104. On the uplink, a strong weak signal from a distant user will receive the desired gain established by the wireless operator. Moderate level signals will also receive desired gain up to the limits of the power amplifier for that channel. For a strong input signal from a nearby user, the associated RF chain will reduce operating gain to confine the output to be within the limits of the power amplifier 104. This gain change only affects the strong signal RF chain, the weak and mid level signals are not affected. Since the separate signals are combined passively by an adder 110 after amplification, the net dynamic range of the output from the repeater can be much greater than that of any individual power amplifier.

The gain changes must react to the input environment in real time. For example, a TDM signal, such as a GSM burst, from a weak signal may be followed by a burst from a strong signal, or vice versa. The power measurement function must have an integration or observation time long enough for a reasonably accurate power estimation. During this measurement time the repeater 100 will still retain its older gain settings so that during the transition from a weak signal to a strong signal the output may exceed the desired operating point of the amplifier 104.

In simpler versions of such a repeater, gain increases may only be allowed at a much slower pace than a gain decrease causing the repeaters gain to 'ride' the level established by that strong signal. While the individual RF channels may have independent gain settings, the gain settings for separate calls' time slots on the same channel will affect each other's performance.

Individual channel repeaters are only cost effective for low RF channel counts. Large channel counts result in fairly large and costly repeaters and the losses associated with the post amplifier combining hardware become significant. For example, summing eight RF channels will reduce output power by greater than 9 dB due to the combining losses.

Figure 2:
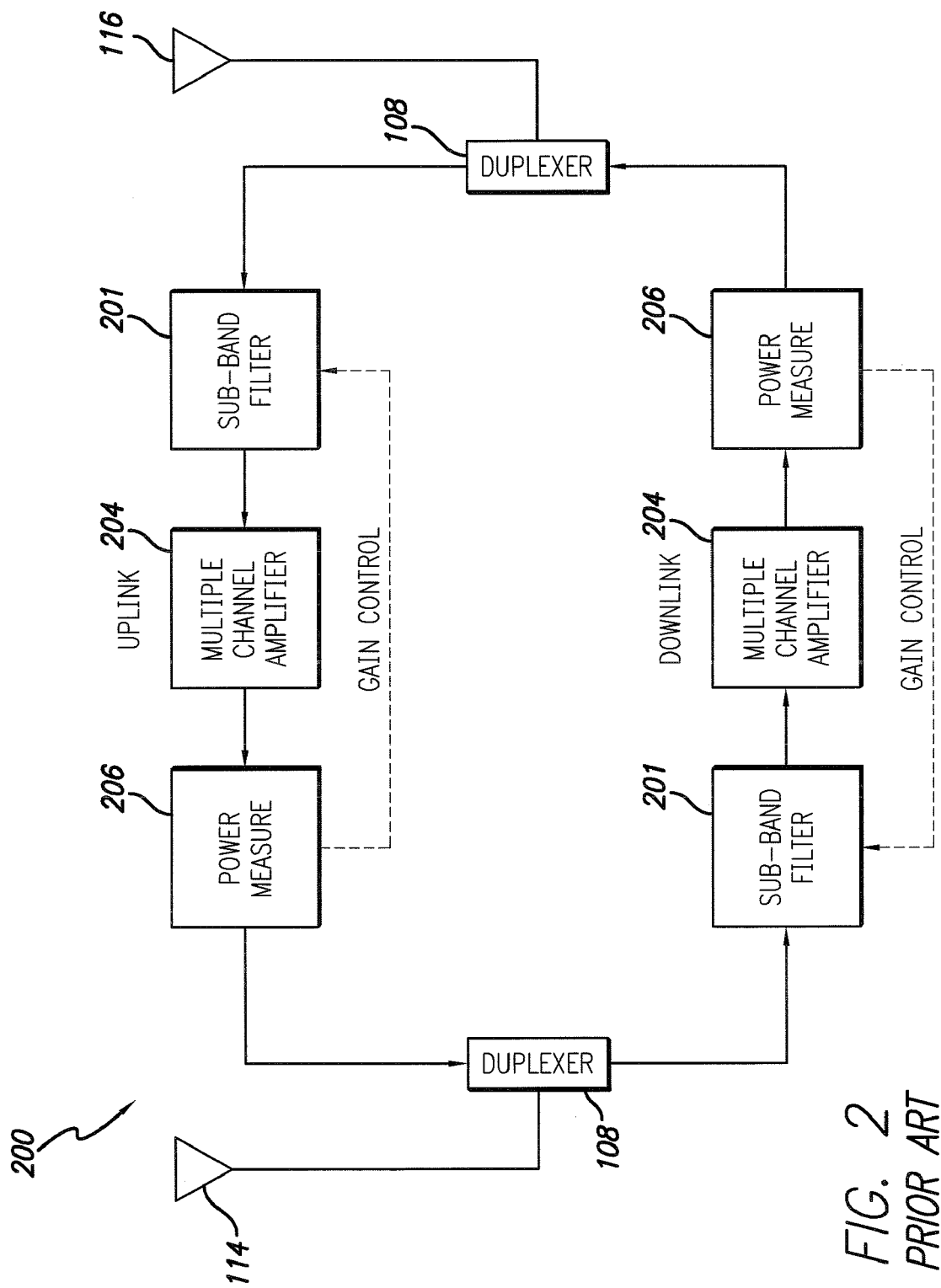
FIG. 2 is a block schematic diagram of a conventional low power RF repeater using multiple channel power amplifiers (MCPA) on the uplink band to process entire RF sub-bands comprising multiple RF signals at once.

FIG. 2 is a block schematic diagram of a conventional low power RF repeater 200 using multiple channel amplifiers 204 to process entire RF sub-bands comprising multiple RF signals at once. This approach greatly reduces cost because less hardware is needed with the power measure unit 206 and sub-band filter 201. However, the gain changes will affect all signals within a sub-band at once. The presence of a strong signal in the sub-band will result in a gain reduction for all mid level and weak signals in that sub-band. This approach has similar time dependent gain control characteristics for TDM signals, as the single channel 102 of FIG. 1. This approach works better for lower gain repeaters that run less of a risk of power amplifier overload.

For agile signals, such as frequency hopping GSM, a sub-band multiple channel based repeater 200 is the simplest choice. The sub-band spans all channels in the GSM signal's hop set. For frequency hopping signals, an individual channel based repeater will require a fast tuning RF chain with a mechanism for quickly detecting frequency changes. Even with a fast tuning RF chain, there will be delays associated with the detection of the active frequency channel leading to the loss of the leading edge of the hopping signal. If it is not possible to build a fast tuning RF chain, then extra RF chains would be needed to be provisioned to span all possible channels of operation. However this is not usually cost effective.

Figure 3:
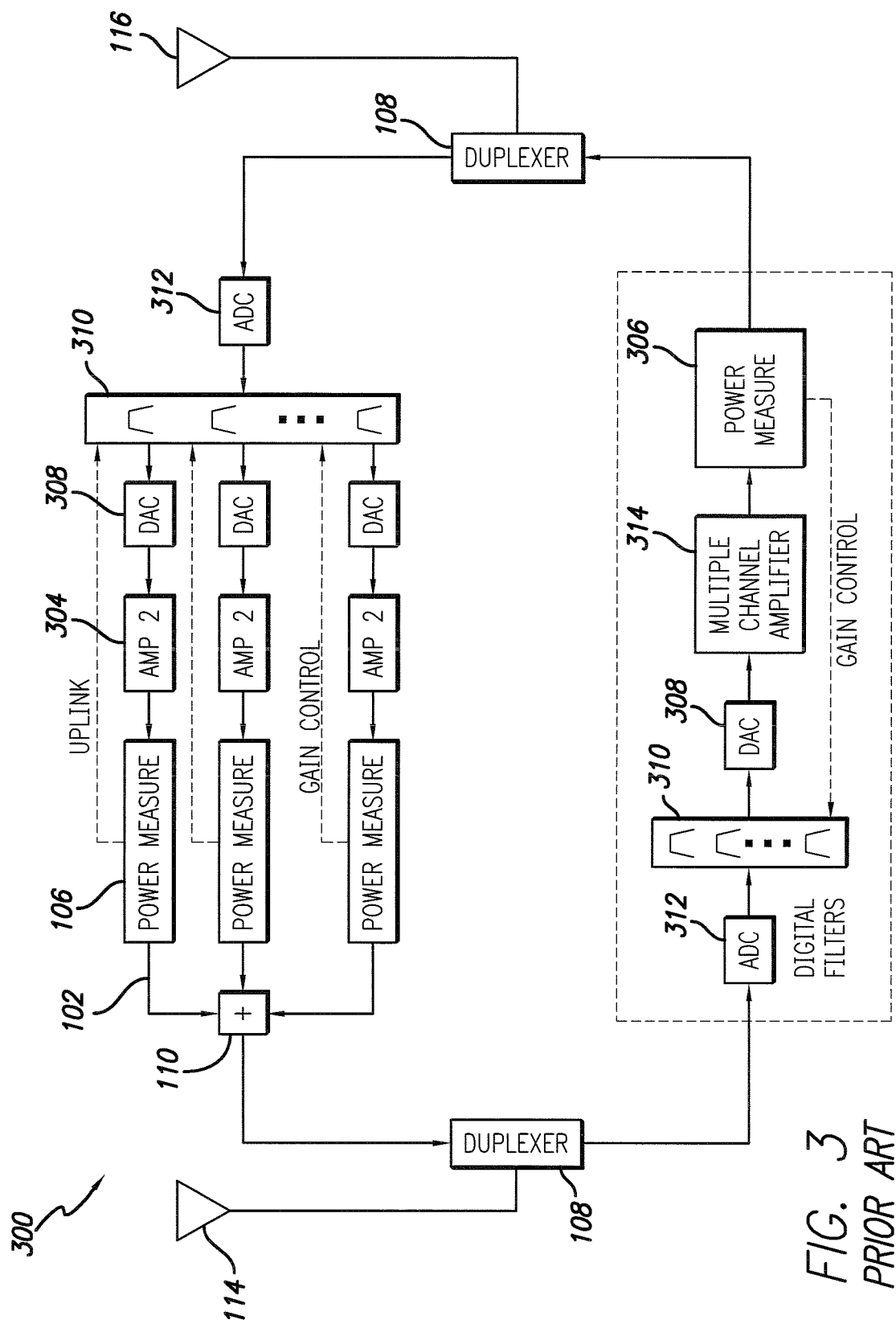
FIG. 3 is a block schematic diagram of a conventional high power RF repeater having a SCPA on the uplink, where the uplink band is digitized and filtered by a bank of digital filters.
Figure 4:
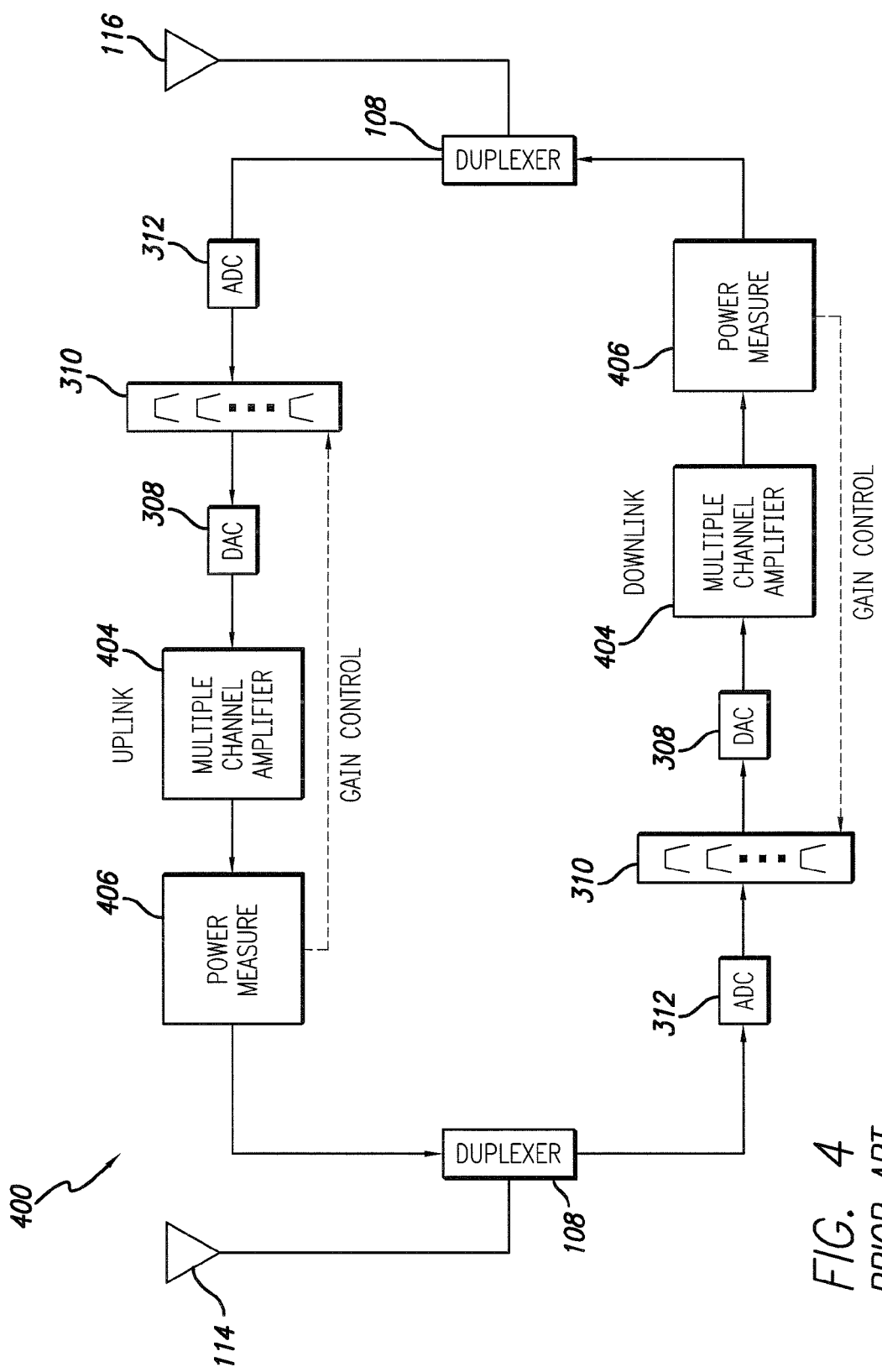
FIG. 4 is a block schematic diagram of a conventional low power RF repeater having a MCPA on the uplink, where the uplink band is digitized and filtered by a bank of digital filters.

FIGS. 3 and 4 illustrate examples of digital processing based repeaters that are similar to those of FIGS. 1 and 2. In both FIGS. 3 and 4, the uplink band of interest is digitized and subsequently filtered by a bank of digital channel and/or sub-band filters 310. FIG. 1 shows a digital channel filter being used with a separate amplifier 104 for each RF channel 102 of interest. As with the analog equivalent of FIG. 1, the gain of each channel in FIG. 3 can be separately controlled without gain reductions for strong input signals affecting the gain setting for the weak and moderate level signals. The outputs of each of the power amplifiers 304 are combined passively by adder 110 to feed a common donor side antenna 114 that is pointed toward the donor base station.

Due to the use of separate power amplifiers 304, this approach also becomes cost prohibitive for large RF carrier counts. This approach does alleviate some of the cost impacts of supporting frequency hopping GSM signals, since fast tuning digital filters 310 can be easier to implement than analog ones. It still has the limitation of the previously discussed repeaters with gain settings slightly lagging input signal levels due to power level measurement time requirements. For the downlink, the lower dynamic range requirement on the downlink allows use of either single channel amplifiers 304 or multiple channel amplifiers 314.

FIG. 4 is a block schematic diagram of a conventional low power RF repeater having a MCPA on the uplink, where the uplink band is digitized and filtered by a bank of digital filters 310. In the digital repeater 400 individual RF channels can be filtered to eliminate the presence of interfering signals but the presence of any strong repeated signals will still affect the gain of all the RF channels. Frequency hopping signals can be accommodated with either fast tuning channel filters or sub-band filters which span the entire hop set. The former has latency issues with the leading edge of each TDM burst while the latter will allow noise on unoccupied/unused channels to be transmitted by the repeater 400. The unwanted noise may limit the amplifier 404 output level due to emission requirements. This makes adaptive tuning preferable for higher power/higher gain repeaters.

FIG. 5 illustrates a block schematic diagram of a high power repeater having a MCPA uplink using delay based digital processing according to an embodiment of the present invention. The repeater 500 includes duplexers 108, multiple channel amplifiers 502, a digital to analog converter 508, adaptive gain digital filter banks 501, an analog to digital converter 512, and antennas 114 and 116. In FIG. 5, the repeater 500 employs a solution to the specific problem of gain settings in a digitally based repeater's 500 uplink processing. The adaptive gain digital filter 504 includes a gain unit 503, a delay buffer 504, a power measure unit 506, and digital filters 510. Precisely controlled, moderate length, delays are simple and inexpensive to implement in the digital domain.

The digital delay 504 is used to create a time differential between the signal destined for the multi-channel power amplifier 502 and the non-delayed signal sent to the power measurement unit 506. By delaying the output signal prior to the power amplifier 502, the power measurement unit 506 can effectively look ahead in time to adjust the gain settings of the adaptive gain filter 501 prior to the arrival of a leading edge of a strong user signal. This prevents the presence of any single strong traffic channel burst from reducing the gain on any other signal in either the time or frequency domain. The delay also prevents the leading edge of a strong signal burst from temporarily overloading the MCPA 502 and corrupting the repeater's 500 output.

The dynamic gain settings for each RF channel can be used to implement one of two types of output signal controls:
  Automatic Limit Control (ALC)—Limit, i.e. cap, the power level of the signal and/or burst, leaving weaker signals that are lower than the limit threshold untouched.
  Automatic Gain Control (AGC)—Reducing the power level of strong signals and/or bursts while increasing the power level of weak signals and/or bursts toward a pre-determined target power level.

For ALC, these limits may be either equal for all channels, different yet constant for all RF channels, or be varied over time based upon other criteria within the repeater 500. An example criteria for the last case is to adapt the limits based upon the number of actively transmitting user signals being received by the repeater, or the path loss to the donor base station. To prevent multiple closely spaced gain corrections on strong signals, an extra amount of gain reduction is included that equals the uncertainty of the power measurement of the signal. Hysteresis is used to prevent unnecessary gain cycling when the signal temporarily becomes weaker.

For AGC, all input signals will be mapped to a desired value, but a number of factors need to be accommodated by the transmitter. These factors include:
  incoming signals vary in amplitude at a fairly and high rate and the AGC can not keep up perfectly;
  power measurements include some uncertainty, especially at with weak signals that have low signal to noise ratio;
  and the gain of the transmitter varies to temperature, manufacturing variation, and aging.

Having set the maximum power of the transmitter, the AGC algorithm shall adjust the gain of each incoming signal to a value a bit below the maximum. The exact value depends mostly on the power measurement uncertainty. The power measurement process has to work fast to keep up with GSM bursts, hopping, and fast fading so it has little opportunity to average the readings. Power measurement accuracy depends on the signal to noise ratio of the incoming signal. Weak signals have more uncertainty and require more transmit margins. Each installation of an over the air repeater has a transmitted power "goal" that depends on path loss between the repeater 500 and the donor base station (BTS). To ease installation, the repeater can automatically set the transmit power goal. The repeater measures path loss by measuring the BTS signal level received at the repeater and performing a calculation that includes knowledge of the BTS transmit power. This enables the repeater to adapt to changing path loss due to environment variations, such as foliage changes, building construction and other obstacles.

One advantage of the multicarrier embodiment is that it would reduce power to strong incoming signals and increase power allocated to weaker signals, because the strong signals can have more precisely controlled gain and do not suffer from SNR degradation at the input to the repeater. Another advantage is that a varying carrier count embodiment would measure the total power of all signals and adjust the power level of each to increase power when handling fewer signals.

Typically for over the air repeater installation to target the repeater uplink noise to the base station to be 10 dB below that of the donor BTS to prevent the repeater's noise floor from desensitizing the BTS. With an AGC algorithm present, the repeater has knowledge of all signals, burst by burst and can be used to compensate for the 10 dB signal level reduction at the donor base station that results from keeping the noise floor low. This enables the repeater to use more gain and allow weak signals at the repeater to reach the base station with increased power. This can improve the system sensitivity to weak signals at the repeater by 10-20 dB for situations where the repeaters have enough gain reserve to support this mode of operation.

Figure 6A:
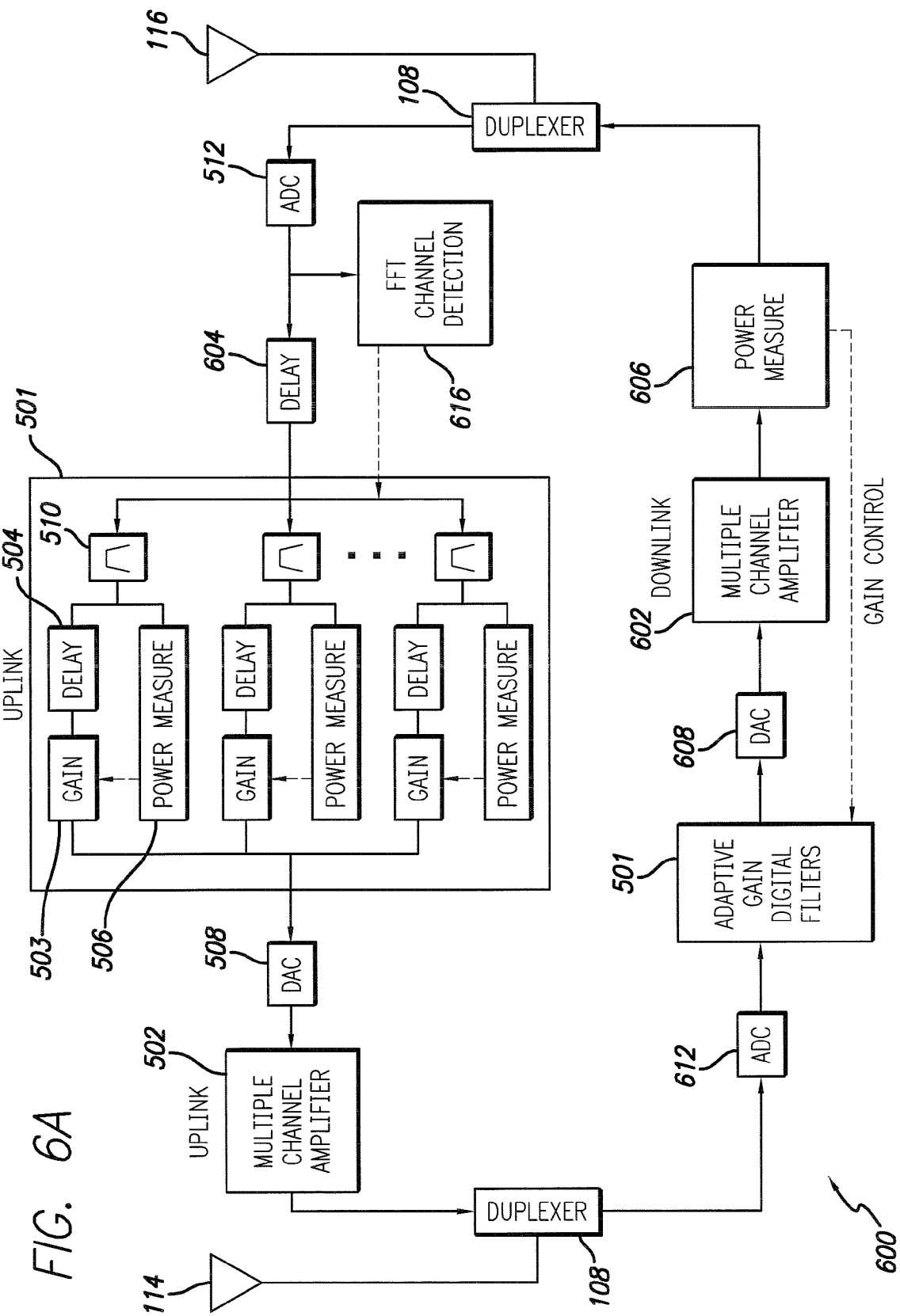
FIG. 6A is a block schematic diagram of the repeater of FIG. 5 having a frequency agile uplink using delay based digital processing, according to an embodiment of the present invention.
Figure 6B:
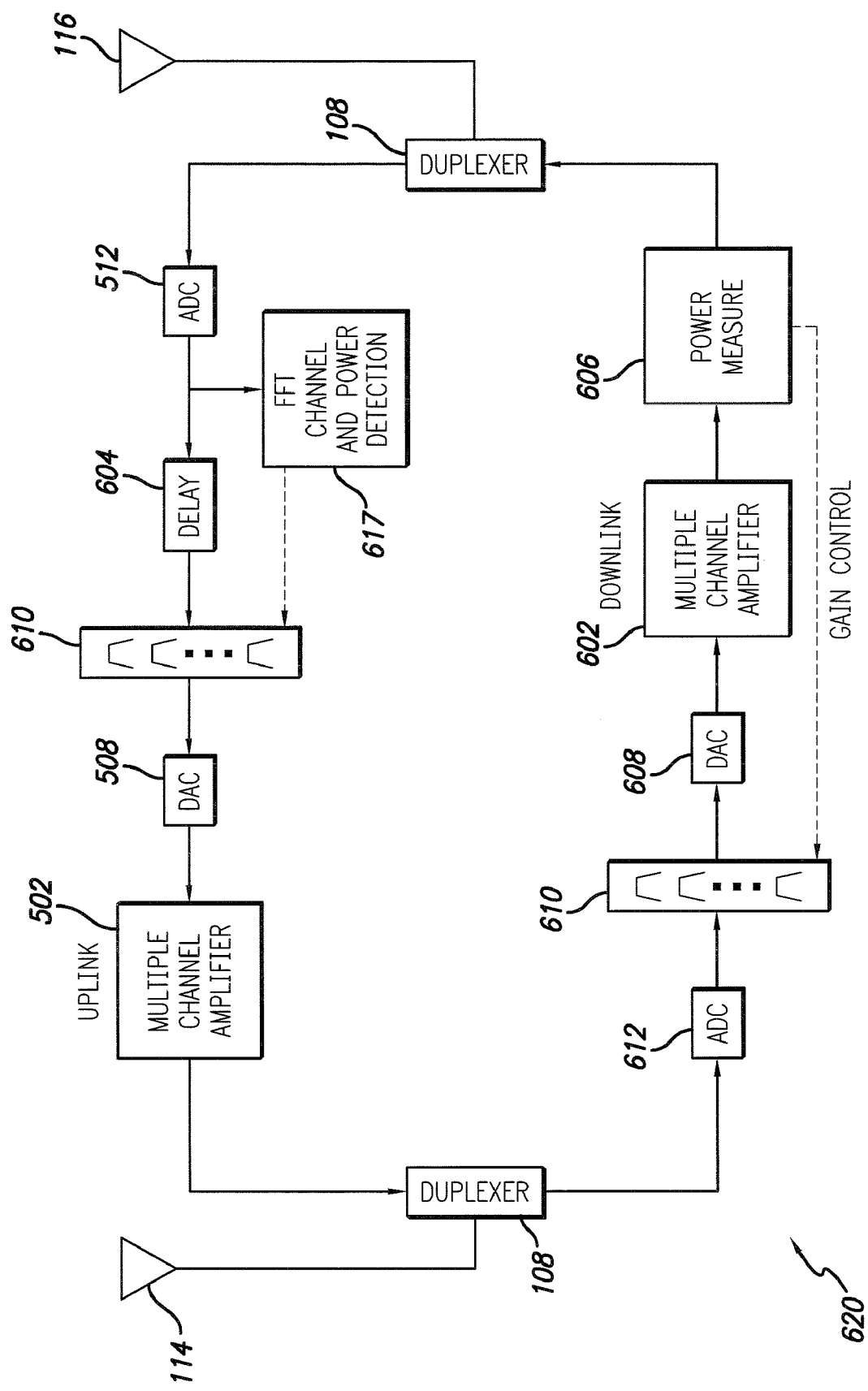
FIG. 6B is a block schematic diagram of an RF repeater having a frequency agile uplink using delay based digital processing feeding a digital filter bank, according to an embodiment of the present invention.

FIG. 6A is a block schematic diagram of the repeater in FIG. 5 having a frequency agile uplink using a broadband digital delay prior to any channel filters. With this embodiment it is possible to add loss free dynamic frequency tracking to the adaptive gain control capabilities of the present invention. As with delay based gain control previously described, the broadband time delay differential allows the repeater to effectively look forward in time to allow the digital channel filters to be tuned to the active channel, e.g. frequency hopping, before it propagates through the repeater. In the adaptive frequency and gain digital filter 501 of FIG. 6A, an FFT 616 is shown as the detection means in this embodiment. Those skilled in the art will appreciate that other spectral estimation and measurement techniques may be applied. Alternatively, the frequency agile uplink using the delay based digital processing may be constructed without the individual delays for each adaptive gain digital filter 501, as shown in FIG. 6B. Here the FFT 617 provides both the frequency detection and power measurement function.

When operated together, as shown in FIG. 6A, delay based frequency function and power measurements allow the repeater 600 to operate at high gain settings to overcome large repeater to donor base station coupling losses, in the presence of both near and distant frequency hopping, e.g., GSM signal sources. A strong nearby frequency hopping source can retune throughout a region occupied by multiple weak signals without concern that the high gain of the repeater will overload the power amplifier 502 and DAC 508 and consequently degrade the weak signals.

This embodiment is preferred over the sub-band approach of FIG. 4 since the agile digital filters 610 suppress the transmission of the repeater's 600 noise floor on unused RF channels, thus allowing the use of higher output power amplifiers with larger repeater operating gains. This is especially significant if the hop sets straddles the sub-bands of other wireless operators which requires greater attention to emissions levels than if the entire sub-band belonged to the owner of the repeater.

Both ALC and AGC work with GSM hopping signals by measuring the incoming power of each burst during the power ramp period of the burst and maybe the first few symbols of the burst. During the burst, the AGC algorithm attempts to hold the gain of the repeater constant to help the demodulator's equalizer to optimize decoding. Both the ALC and AGC algorithms may adjust the gain downward if signal level changes later in the burst threaten to overload the transmitter.

Figure 7:
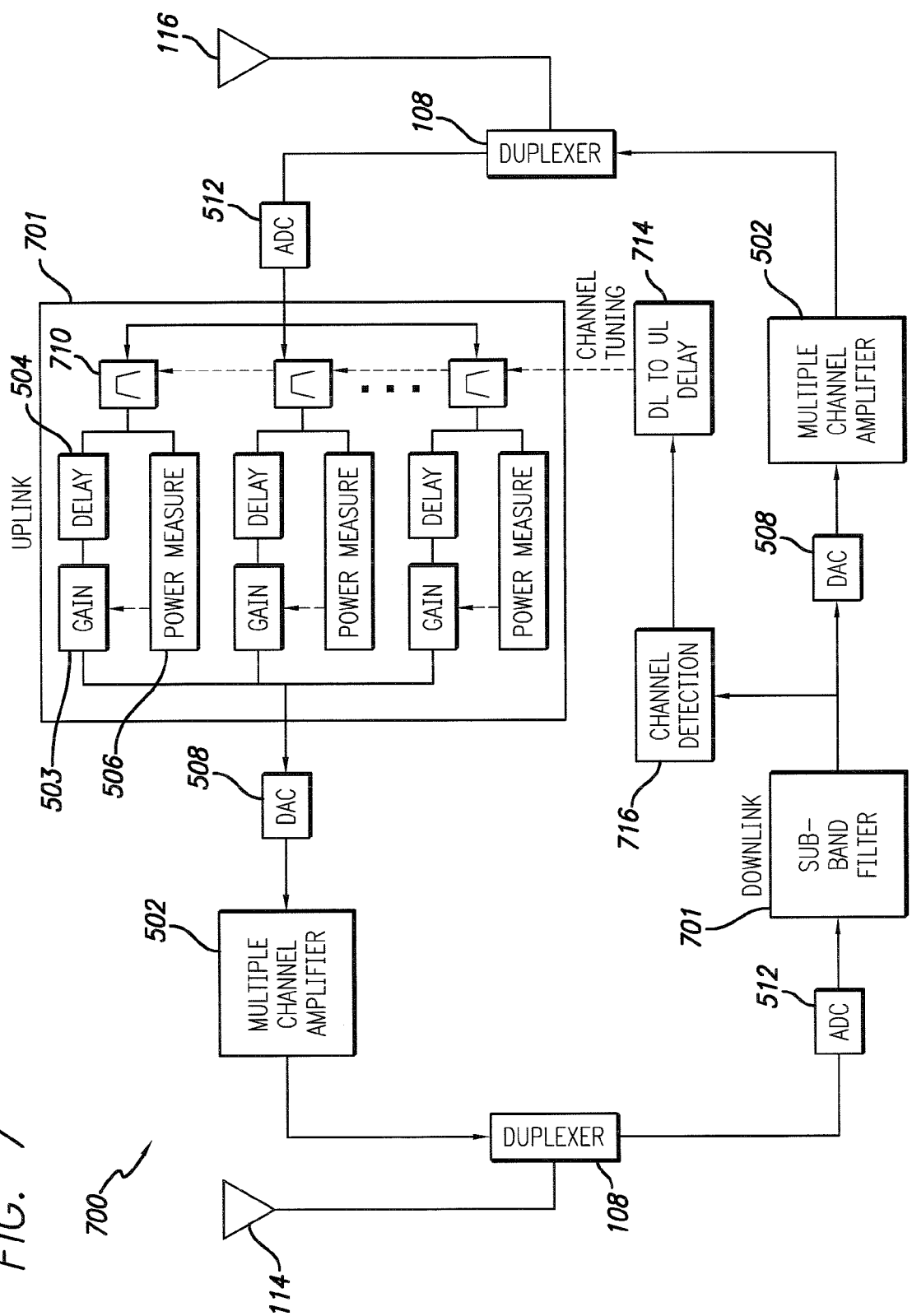
FIG. 7 is a block schematic diagram of an RF repeater having a frequency agile uplink using downlink delay based digital processing, according to an embodiment of the present invention.

In another embodiment of the present invention, FIG. 7 illustrates an RF repeater 700 having a frequency agile uplink and using downlink delay based digital processing to provide frequency tuning based upon measurements of the downlink channels. FIG. 7 is applicable to FDD wireless signal protocols where the frequency offset between the downlink and uplink is a known value. Here the frequency tuning decisions are based upon measurements of the downlink channels at the Channel Detection unit 716. The known frequency offset between the downlink and uplink is used to generate the tuning commands for the uplink's digital filters 710. The known downlink/uplink time difference is used to suitably delay the tuning commands, via the DL to UL Delay 714, to correspond to the reception time of the user's signals at the repeater 700.

To obtain delay based power measurements for gain setting controls, either ALC or AGC, individual delay and power measurement units are associated with each RF channel. This is similar to the non frequency agile diagram of FIG. 5. For the case of GSM signals, the time difference between the downlink and uplink is three burst periods. The repeater 600 of FIG. 6 will measure the frequencies of signals that may be at very low signal to noise ratios while needing to keep the digital delay settings fairly short so not to interfere with base station hand-off operation. The advantage of this embodiment is that it allows for a relatively long measurement length on the downlink, up to the length of the burst. This generates a very accurate identification of the channels of operation for any given time period. The signal levels on the downlink are consistently stronger than those on the uplink and allow for a more accurate frequency estimation.

Figure 8:
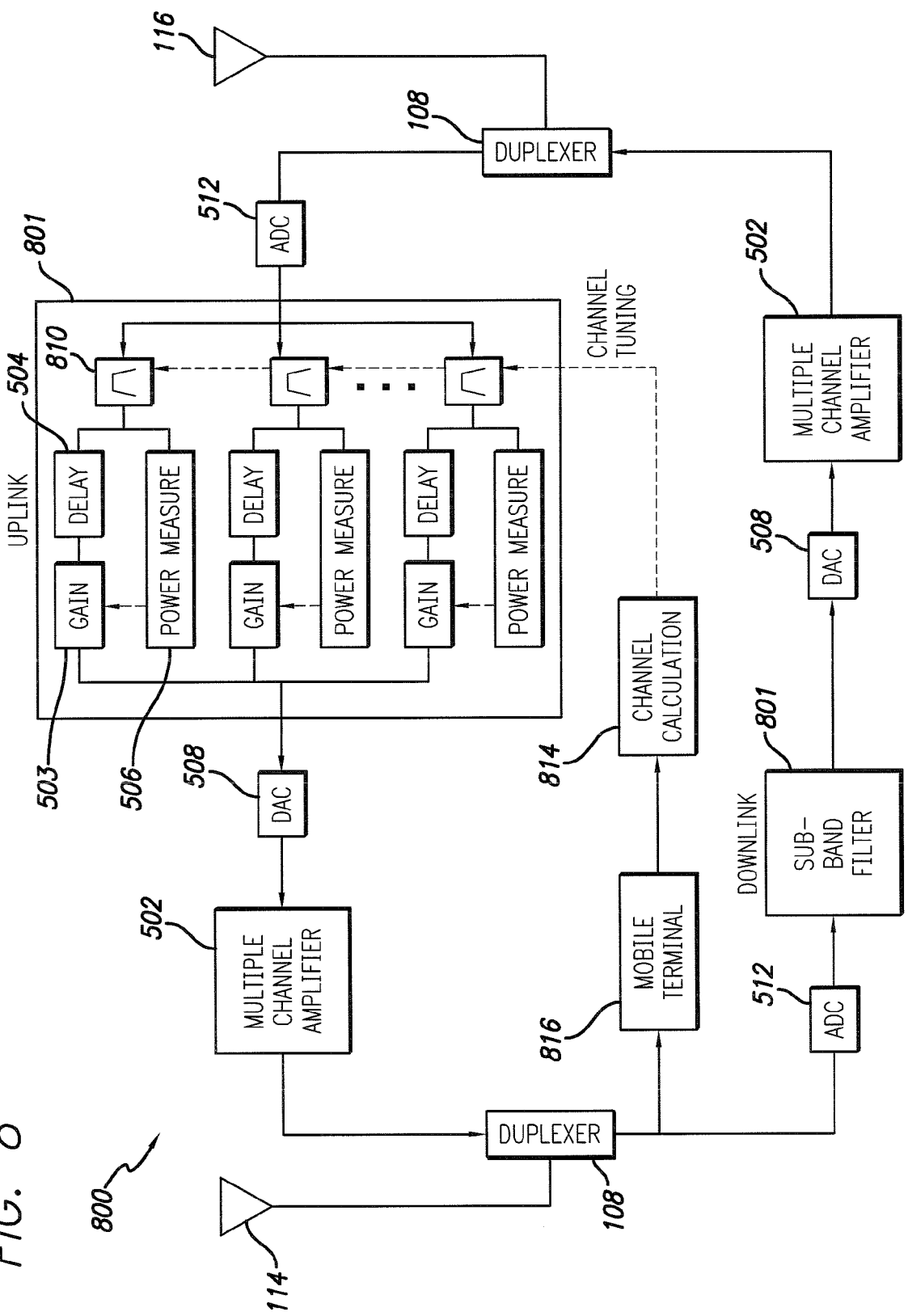
FIG. 8 is a block schematic diagram of an RF repeater having a frequency agile uplink using control channel based digital processing, according to an embodiment of the present invention.

In another embodiment of the present invention, FIG. 8 illustrates a block schematic diagram of an RF repeater having a frequency agile uplink using control channel based digital processing. The repeater 800 processes control data to determine frequency hopping channel setting and hop sequence timing offset information to derive tuning information for uplink adaptive frequency/gain digital filters 801 in the same manner as a user's handset. The repeater 800 uses this information to extract frequency hopping channel set information and hop sequence timing offset information to derive tuning information for the uplink's digital filters 801.

For GSM, the repeater 800 contains a GSM receiver to decode the BTS' Broadcast Control Channel (BCCH), Frequency synchronization channel (FCCH), and burst timing channel (SCCH). This enables the repeater 800 to tune to the correct frequency, synchronize with the frame and slot timing, and decode the hopping sequence. This is accomplished by the Mobile Phone 816 and Channel Calculation unit 814 within the diagram. The adaptive gain portion of this aspect of repeater 800 is the same as that for FIG. 7.

From the above description, those skilled in the art will appreciate that the present invention greatly reduces the effects of the above described limits on the performance of over the air repeaters both by preserving dynamic range and accommodating frequency hopping signals. In one aspect the invention combines digital delay, either broadband or per channel, with the uplink signal detection process to allow dynamic, per channel gain adjustments for each of multiple RF channels. The gain setting for each RF channel can be set independent from each other and can react to the wide power variations possible on a TDM uplink signal. When using this aspect of the invention it is possible to avoid power amplifier output overload due to received input signals while preserving high gain for low level input signals.

The current invention is further expanded by adding dynamic frequency channel detection to support signals such as frequency hopping GSM. When combined with delay based power measurements, a digital repeater can support a dynamic frequency and power level input environment without loss of the leading edge of any TDM burst signal. Multiple frequency detection techniques can be applied to this architecture, such as, delay based uplink measurements, delayed downlink measurements, or direct decoding of the donor base station's control channel.

The foregoing description of preferred embodiments is presented for purposes of illustration and description. Furthermore, the description is not intended to limit the invention to the form disclosed herein. Accordingly, variants and modifications consistent with the following teachings, and skill and knowledge of the relevant art, are within the scope of the present invention. The embodiments described herein are further intended to explain modes known for practicing the invention disclosed herewith and to enable others skilled in the art to utilize the invention in equivalent, or alternative embodiments and with various modifications considered necessary by the particular application(s) or use(s) of the present invention.

What is claimed is:

1. A communication system for enhancing wireless coverage for a host base station, comprising:
   a digital repeater receiving and providing time division multiplexed (TDM) communication signals between a host base station and a communication network for a plurality of RF channels;
   a digital filter for each of the plurality of RF channels, the filter frequencies being aligned to the corresponding RF channel tuning of the host base station;
   a delay buffer for each RF channel configured to provide a time delayed TDM signal for a power measurement on the RF channel;
   a power measurement unit; and
   a gain setting unit for each RF channel receiving the time delayed communication signal and power measurement for adjusting a gain setting on each RF channel;
   wherein the time delay creates a time differential between a filtered TDM signal from the delay buffer and a filtered TDM signal fed into the power measurement unit.

2. The communication system of claim 1, wherein the gain setting for each individual RF channel is set independent from the other of the plurality of RF channels to prevent power amplifier output overload due to varying power levels of each of the plurality of received TDM signals.

3. The communication system of claim 1, wherein the gain setting unit provides gain setting for an output for each of the plurality of RF channels based on automatic limit control (ALC), wherein a power level of the TDM signal is limited to a threshold level.

4. The communication system of claim 3, wherein the automatic limit control gain setting limits are equal for all RF channels.

5. The communication system of claim 1, wherein the gain setting unit provides gain setting for an output for each of the plurality of RF channels based on automatic gain control (AGC), wherein a power level of the TDM signal is reduced for strong signals above a threshold level and the power level is increased for a weak signal below the threshold level.

6. The communication system of claim 5, wherein the automatic gain control adjusts the gain for each incoming TDM signal to a value below a maximum gain level.

7. The communication system of claim 1, further comprising;
   a broadband digital delay configured for the digital filter to be tuned to an active RF channel before the TDM signal propagates through the repeater.

8. The communication system of claim 7, wherein a Fast Fourier Transform (FFT) circuit detects an uplink TDM signal and measures a leading edge burst of the uplink TDM signal to determine a corresponding RF channel.

9. The communication system of claim 1, further comprising:
   a down link to uplink delay; and
   a channel detection unit for determining a frequency offset between the downlink and uplink for generating tuning commands for an uplink digital filter,
   wherein frequency tuning is based on the downlink measurement.

10. A method for adjusting an over the air repeater for enhancing coverage in a wireless communication system, the method comprising:
    providing and receiving a plurality of digital time division multiplexed (TDM) signals for each of a plurality of RF channels;
    filtering and splitting the plurality of digital TDMA signals for each of the plurality of RF channels;
    delaying a digital filtered TDM signal to provide a power measurement of each of the plurality of RF channels;
    measuring the power level of each of the filtered digital TDM signals; and
    adjusting the filtered digital TDM signal gain setting based on the individual power measurement on each of the plurality of RF channels;
    wherein the delay creates a time differential between a filtered TDM signal from a delay buffer and a filtered TDM signal fed into a power measurement unit.

11. The method of claim 10, further comprising:
    controlling the gain setting output for each of the plurality of RF channels based on automatic limit control (ALC), wherein the power level of each TDM signal is limited to a threshold level.

12. The method of claim 10, further comprising:
    controlling the gain setting output for each of the plurality of RF channels based on automatic gain control (AGC), wherein the power level of the TDM signal is reduced for strong signals above a threshold level and the power level is increased for weak signals below the threshold level.

13. The method of claim 10, further comprising;
    providing a broadband digital delay configured for the digital filter to be tuned to an active RF channel before the TDM signal propagates through the repeater.

14. The method of claim 13, wherein a Fast Fourier Transform (FFT) circuit detects and measures an uplink TDM signal to determine a corresponding RF channel.

15. The method of claim 10, further comprising:
    determining a down link to uplink delay; and
    determining a frequency offset between the downlink and uplink for generating tuning commands for an uplink digital filter,
    wherein frequency tuning is based on the downlink measurement.

16. A communication system for enhancing wireless coverage for a host base station, comprising:
    a digital repeater receiving and providing communication signals between a host base station and a communication network for a plurality of RF channels;
    a Fast Fourier Transform (FFT) circuit for detecting an uplink communication signal and measuring frequency during the leading edge burst of the uplink communication signal to determine a corresponding RF channel;
a first delay buffer configured to provide a time delay for the FFT circuit to detect the uplink communication signal; and
a digital filter for each of the plurality of RF channels, the filter being synchronized to the corresponding RF channel timing of the host base station by the FFT circuit; wherein the time delay creates a time differential between a filtered TDM signal from the delay buffer and a filtered TDM signal fed into a power measurement unit.

17. The communication system of claim 16, further comprising:
a second delay buffer for each RF channel configured to provide a time delay for a power measurement on the RF channel; and
a gain setting unit for each RF channel receiving the time delayed signal and power measurement for adjusting a gain setting on each RF channel.

18. The communication system of claim 17, wherein gain setting an output for each of the plurality of RF channels is based on at least one of:
an automatic limit control (ALC), wherein a power level of the communication signal is limited to a threshold level; and
an automatic gain control (AGC), wherein a power level of the communication signal is reduced for strong signals above a threshold level and the power level is increased for weak signals below the threshold level.

* * * * *